United States Patent
De Vaan et al.

(10) Patent No.: US 9,648,755 B2
(45) Date of Patent: May 9, 2017

(54) METHOD FOR MANUFACTURING A NON-PLANAR PRINTED CIRCUIT BOARD ASSEMBLY

(71) Applicant: PHILIPS LIGHTING HOLDING B.V., Eindhoven (NL)

(72) Inventors: Adrianus Johannes Stephanus Maria De Vaan, 'S-Hertogenbosch (NL); Wilhelmus Gerardus Maria Peels, Valkenswaard (NL); Josephus Paulus Augustinus Deeben, Valkenswaard (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/772,888

(22) PCT Filed: Dec. 17, 2014

(86) PCT No.: PCT/EP2014/078131
§ 371 (c)(1),
(2) Date: Sep. 4, 2015

(87) PCT Pub. No.: WO2015/101494
PCT Pub. Date: Jul. 9, 2015

(65) Prior Publication Data
US 2016/0316570 A1    Oct. 27, 2016

(30) Foreign Application Priority Data

Jan. 2, 2014  (EP) .................................. 14150070

(51) Int. Cl.
*H05K 3/02* (2006.01)
*H05K 3/32* (2006.01)
(Continued)

(52) U.S. Cl.
CPC .............. *H05K 3/32* (2013.01); *H05K 1/0284* (2013.01); *H05K 1/092* (2013.01); *H05K 3/0014* (2013.01);
(Continued)

(58) Field of Classification Search
CPC ..... G03F 1/14; G03F 1/60; G03F 7/24; G03F 7/703; G03F 7/7035
See application file for complete search history.

(56) References Cited

U.S. PATENT DOCUMENTS 4,584,767 A * 4/1986 Gregory ............ B29C 45/14639
174/255
4,912,288 A     3/1990 Atkinson et al.
(Continued)

FOREIGN PATENT DOCUMENTS

CN     101814465 A    8/2010
CN     102738361 A    10/2012
(Continued)

*Primary Examiner* — Minh Trinh

(57) ABSTRACT

A method for manufacturing a non-planar printed circuit board assembly (1) is disclosed. The method comprises providing a planar formable substrate (2) for supporting a conductive material (3) and at least one electronic component (4), printing a circuit pattern of an uncured conductive material (3) on the planar substrate (2), forming the substrate (2) and the uncured conductive material (3) into a non-planar shape, and curing the conductive material (3), wherein the substrate (2) comprises a metal sheet and an electrically insulating coating (2*b*) arranged between the metal sheet and the conductive material (3).

12 Claims, 3 Drawing Sheets

(51) Int. Cl.
*H05K 1/02* (2006.01)
*H05K 1/09* (2006.01)
*H05K 3/00* (2006.01)
*H05K 3/12* (2006.01)
*H05K 3/44* (2006.01)
*H05K 1/05* (2006.01)

(52) U.S. Cl.
CPC .......... *H05K 3/0061* (2013.01); *H05K 3/125* (2013.01); *H05K 3/1216* (2013.01); *H05K 3/44* (2013.01); *H05K 1/056* (2013.01); *H05K 3/321* (2013.01); *H05K 2201/0129* (2013.01); *H05K 2201/09727* (2013.01); *H05K 2201/09736* (2013.01); *H05K 2201/10106* (2013.01); *H05K 2201/10113* (2013.01); *H05K 2203/1461* (2013.01)

(56) References Cited

U.S. PATENT DOCUMENTS

| | | | |
|---|---|---|---|
| 5,090,122 A | 2/1992 | Kitagawa | |
| 5,761,801 A * | 6/1998 | Gebhardt | H05K 3/045 174/255 |
| 7,987,589 B2 * | 8/2011 | Huang | H05K 1/0284 29/830 |
| 8,017,308 B2 * | 9/2011 | Hogue | G03F 1/14 430/322 |
| 2009/0158581 A1 * | 6/2009 | Nguyen | H05K 3/108 29/592.1 |
| 2010/0323102 A1 * | 12/2010 | Chopra | C09D 11/101 427/125 |
| 2011/0154661 A1 | 6/2011 | Park et al. | |
| 2013/0082298 A1 | 4/2013 | Golle et al. | |
| 2015/0325755 A1 * | 11/2015 | Speer | H01L 33/486 257/99 |

FOREIGN PATENT DOCUMENTS

| | | |
|---|---|---|
| DE | 1243746 B | 7/1967 |
| DE | 19807202 A1 | 8/1999 |
| DE | 102008042810 A1 | 4/2010 |
| EP | 0477981 A2 | 4/1992 |
| JP | 60182195 A | 9/1985 |
| JP | 2013182831 A | 9/2013 |
| WO | 8701557 A1 | 3/1987 |
| WO | 2010002156 A2 | 1/2010 |
| WO | 2015003929 A1 | 1/2015 |

* cited by examiner

METHOD FOR MANUFACTURING A NON-PLANAR PRINTED CIRCUIT BOARD ASSEMBLY

CROSS-REFERENCE TO PRIOR APPLICATIONS

This application is the U.S. National Phase application under 35 U.S.C. §371 of International Application No. PCT/EP2014/078131, filed on Dec. 17, 2014, which claims the benefit of European Patent Application No. 14150070.2, filed on Jan. 2, 2014. These applications are hereby incorporated by reference herein.

FIELD OF THE INVENTION

The present disclosure relates to a method for manufacturing a non-planar printed circuit board assembly, in particular for use in lighting systems.

BACKGROUND OF THE INVENTION

Various methods for creating printed electronics are known in the art. They generally involve electrically connecting electronic components on a substrate by printing layers of a conductive material onto the substrate. Many standard printing techniques can be employed, for example screen printing and inkjet printing. A wide variety of printed circuit assemblies are currently produced by these methods, for example assemblies with light-emitting diodes (LEDs) for use in lighting systems. An example of an LED arranged on a substrate is disclosed in US 2013/0082298 A1. The LED is electrically coupled by a conductive ink which can be printed on the substrate.

The area of printed electronics is considered an emerging area that offers great promise for cost reductions and new design solutions for electronic products. Several directions for further development within the area of printed electronics can be identified. For instance, it is possible to improve current methods for creating printed electronics having non-planar substrates. In lighting systems, as well as in many other applications, it is desirable to use such substrates as they allow for creative product designs which are well adapted to the application in question.

WO87/01557 discloses printing of an electro-conductive ink on a flexible film of insulating material and which is left uncured. The curing is effected by further processing. The film is then formed, using e.g. thermo-forming, into non-planar shape.

SUMMARY OF THE INVENTION

A general objective of the present disclosure is to provide an improved or alternative method for manufacturing a non-planar printed circuit board assembly. Specific objectives include providing an improved or alternative method for manufacturing a non-planar printed circuit board assembly for lighting systems, in particular lighting systems with solid-state lighting (SSL) devices, such as LED light engines, LED lamps and LED luminaires.

The invention is defined by the independent claims. Embodiments are set forth in the dependent claims, the description and the drawings.

According to a first aspect, a method for manufacturing a non-planar printed circuit board assembly is provided. The method comprises the steps of: providing a planar formable substrate for supporting a conductive material and at least one electronic component, printing a circuit pattern of an uncured conductive material on the planar substrate, forming the substrate and the uncured conductive material into a non-planar shape, and curing the conductive material, wherein the substrate (2) comprises a metal sheet and an electrically insulating coating (2b) arranged between the metal sheet and the conductive material (3).

This method implies that the substrate with the printed conductive material is formed into a desired non-planar shape before the conductive material is cured. The conductive material is therefore flexible during the forming step and can easily adapt to the changing shape of the substrate. As a result, the risk of harmful stresses and strains in the circuit pattern of the finished non-planar printed circuit assembly is very low. Stresses and strains in the cured conductive material may reduce its conductivity, for example by causing the formation of cracks. By this method, then, it is possible to manufacture a non-planar printed circuit board assembly that meets high technical performance standards. Moreover, since standard printing and forming techniques can be used, the method provides a simple way to manufacture a non-planar printed circuit board assembly. Not only does such a circuit board allow for a high degree of design flexibility, but it can also be particularly suitable for use with high-power electronic components, such as SSL devices, because of the printed circuit pattern. It can be difficult to provide the level of conductivity required by such electronic components using other types of circuit boards, for example wired circuit boards.

A non-planar shape is for example a wavy shape, an indented shape, a rounded shape and/or an angular shape. For example, a non-planar shape may comprise two or more connected and mutually angled planar regions (the angle is different from 180 degrees). In its simplest form the non-planar shape is the result of bending, or forming, the substrate along a line over a specific angle resulting in two connected and mutually angled planar regions which have an angle with respect to each other that is different from 180 degrees.

As a result of the forming process the printed conductive material may have a thickness and/or width at the non-planar locations where the substrate is deformed, i.e. where the substrate is deformed out of its original planar shape, which deviates from the thickness and/or width on regions of the substrate that are not deformed, i.e. on planar regions of the substrate, if these planar regions are comprised in the non-planar shape of the substrate. Furthermore, because of the method according to the invention, discontinuities, such as cracks, at the non-planar locations or regions, i.e. where the substrate is deformed out of its original planar shape, of the cured conductive material are reduced considerably, or even absent, compared to prior art methods. Because of the method according to the invention, in which the conductive material is cured after the forming of the substrate, the conductive material will exhibit less stress, resulting in less, or even zero, cracks or other discontinuities in the conductive material.

The uncured conductive material can be printed on the substrate using screen printing technology or inkjet printing technology. These are cost-effective and versatile printing methods which can be used together with many different kinds of conductive materials and substrate materials.

The substrate and the uncured material can be formed into a non-planar shape by vacuum deep drawing, or low pressure forming or high pressure forming. These are simple forming techniques by which many different types of shapes can be produced quickly and economically. Moreover, they are particularly suitable to use with substrates of the kind that are often used in lighting systems. In general, however, any thermoforming or other forming method can be used for forming the substrate and the uncured material. If the printed circuit board assembly is intended to be mounted on a heat sink, it may be advantageous to form the substrate into a shape of a surface of the heat sink as this may help improve the transfer of heat from the circuit board assembly. The substrate can for example be formed into a non-planar shape on top of the heat sink.

The method can comprise arranging at least one electronic component, typically several, on the planar substrate. The electronic components can be arranged on the planar substrate before or after printing. Note that it is conceivable to arrange the electronic components on the substrate after it has been formed into a non-planar shape, but it is typically easier to arrange them on a planar substrate.

It can be advantageous to use a conductive material such that, after curing, the conductive material mechanically secures the electronic components to the substrate. Using such a conductive material can reduce the number of manufacturing steps, since a separate step of attaching the electronic components to the substrate may not be necessary. This renders a simple and economical manufacturing process possible.

The uncured conductive material can be printed on the planar substrate such that a conductive path of the circuit pattern has sections with a first thickness and sections with a second thickness which is different from the first thickness. The second thickness can for example be greater than the first thickness. During the forming step, the substrate and the uncured pattern of conductive material can be bent or deformed in those places where the conductive path has the second thickness. This may result in a conductive circuit having a high reliability. Furthermore, this embodiment may compensate for a thickness variation of the conductive material as a result of the bending, or deformation, of the conductive material at certain locations or regions. By "thickness" is here meant the size of a conductive path in a direction substantially perpendicular to the substrate surface onto which the conductive path is arranged. The first thickness being different from the second thickness means that the sections with the first thickness have a different cross section, in a plane perpendicular to the substrate surface onto which the conductive material is printed, than the sections with the second thickness. In addition or alternatively, the conductive path of the circuit pattern may have sections with a first width and sections with a second width similar to the thickness of the conductive path. By "width" is here meant the size of a conductive path in a direction substantially parallel with the substrate surface onto which the conductive path is arranged.

The electronic components can comprise one or more SSL devices, for example semiconductor LEDs, organic LEDs, polymer LEDs and/or laser diodes. A non-planar circuit board assembly, which has been manufactured according to any of the variants of the method described above and which comprises one or more SSL devices mounted on the substrate, can be particularly suitable for use in a lighting system, because such a circuit board may facilitate the provision of creative product designs and efficient lighting solutions. The conductive material of such a lighting system can mechanically secure said one or more SSL devices to the substrate. In some applications, the substrate of the lighting system can advantageously be provided in the form of a metal sheet having an electrically insulating coating. Such a coating is typically arranged between the metal sheet and the conductive material. The coating may comprise light reflecting particles, for example particles which are diffusely reflective. Furthermore, the coating can comprise particles intended to improve the thermal conductivity of the substrate.

For the efficient removal of heat from the electronic components, the lighting system may include a heat sink onto which the substrate is arranged. The substrate can for example be laminated on the heat sink. The substrate can have the shape of a surface of the heat sink facing the substrate. Matching the shape of the non-planar substrate to a shape of the heat sink may improve the transfer of heat from the electronic components to the heat sink. It can be advantageous to form the substrate and the uncured conductive material directly on the heat sink as this may reduce tolerance requirements for manufacturing both the non-planar printed circuit board assembly and the heat sink. This, in turn, may enable a faster manufacturing process as well as reduce the cost and increase the life time of the manufacturing tools.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

Figure 1:
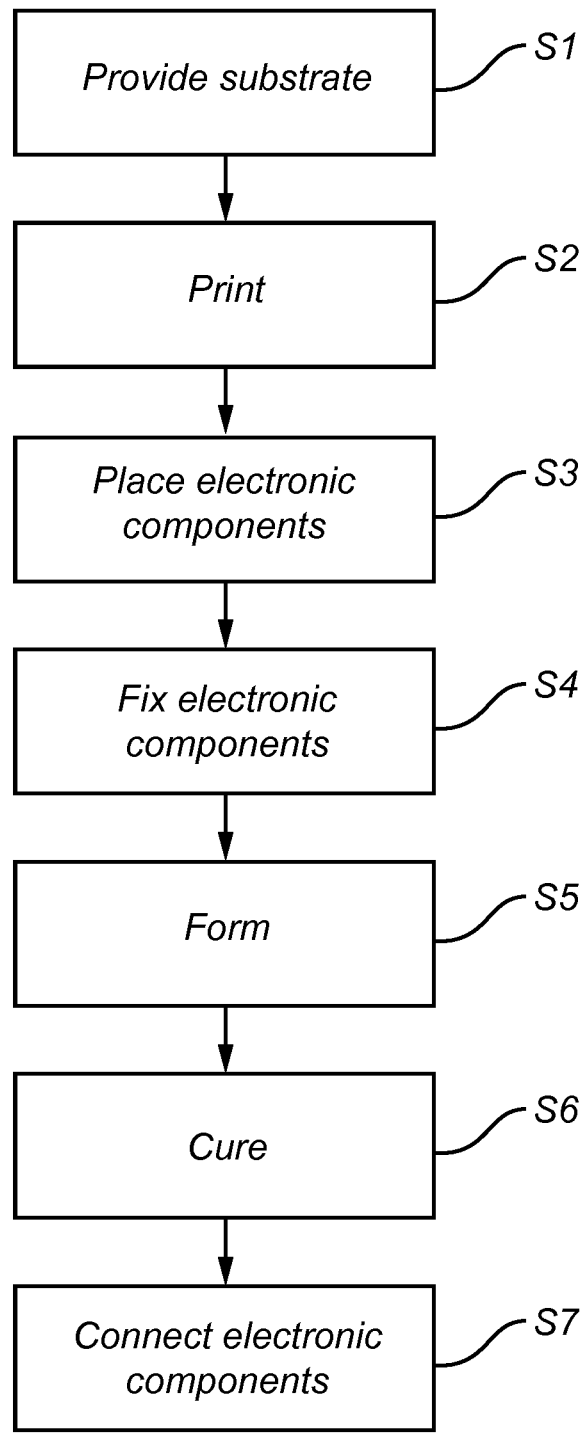
FIG. 1 is a flowchart of a method for manufacturing a printed circuit board assembly.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

A method for manufacturing a non-planar printed circuit board assembly 1 will be described with reference to FIG. 1 and FIGS. 2a to 2c. In step S1, a planar substrate 2 for supporting a conductive material 3 and at least one electronic component 4 is provided. The substrate 2 can be a sheet, a tape, a plate or a thin film. The substrate 2 can be a laminate. The substrate 2 can be transparent or non-transparent. The substrate 2 can be diffusely reflective or specularly reflective. The substrate 2 can be made of any suitable material, for example a thermoplastic material. The thermoplastic material can be PET, ABS or polycarbonate (PC). The thermoplastic material can be a thermoset material in its B-stage, such as epoxies and polyimides. The substrate 2 can be reinforced with paper and/or glass fiber.

The substrate 2 can have a coating 2b onto which a conductive material 3 is printed in step S2 (see below). The coating 2b may form a pattern, and it can be made of a plastic material. The coating 2b can be electrically insulating. As an example, the substrate 2 can be a metal sheet covered with a coating 2b of an electrically insulating material. The metal sheet can be an aluminum sheet. The coating 2b can be specularly reflective or diffusely reflective. The coating 2b can for example be white. The coating 2b may comprise several layers, one or more of which can be specularly reflective or diffusely reflective. One or more of the layers can be white. The coating 2b may comprise particles 2a for improving the reflectivity and/or the thermal conductivity of the substrate 2. The particles 2a can be formed by aluminum powder and/or titanium dioxide powder. The particles 2a can be formed by a thermally conductive core covered with a light reflective material and/or an electrically insulating material.

In step S2, a conductive material 3 is printed on the substrate 2. The printing method can be, for example, screen printing or inkjet printing. After printing, the conductive material 3 forms a layer having a desired pattern on the substrate 2. The pattern can be defined by a printing mask 5. Various types of conductive materials 3 can be used. The conductive material 3 can for example be chosen from the group consisting of Ag, Cu and a mixture of Ag and Cu. The conductive material 3 can be a printing paste.

The conductive material 3 can be one part of a compound, for example a suspension. The compound may comprise a second material forming an insulator after curing. The second material can be chosen from the group consisting of acrylates, polyurethanes, polyimides, melamine resin and melamine formaldehyde. The compound can form layers, which are substantially parallel with the plane of the substrate, after printing. For example, the conductive material 3 can form a conductive layer on top of which the second material forms an insulating layer, i.e. the conductive layer is arranged between the substrate 2 and the insulating layer which thereby forms an electrical safety barrier. If the compound is printed on the substrate using screen printing, the combined thickness of the conductive layer and the insulating layer is typically about 20 μm or less. If inkjet printing is used, the combined thickness of the layers is typically about 5 μm or less. The compound may comprise additives, for example additives that create colloids in the second material. The use of additives may render the manufacturing process more effective. The compound can comprise light reflective particles, something which may be advantageous if the printed circuit board assembly is intended for a lighting system. The light reflective particles can be specularly reflective or diffusely reflective. The light reflective particles can be spherical. Alternatively, or additionally, the compound may comprise light refractive particles. The refractive index of the light refractive particles can be from about 1.3 to about 1.7, and it typically differs from the refractive index of the base material of the compound by 0.1 or more. The light refractive particles can be polymer spheres, or they can be glass spheres with a refractive index of about 1.5.

The conductive material can be printed on the planar substrate such that a conductive path of the circuit pattern has sections with a first thickness and/or first width and sections with a second thickness and or second width which is different from the first thickness and/or second width. The second thickness and or second width can for example be greater than the first thickness and/or first width. During the forming step, the substrate and the uncured pattern of conductive material is then be bent or deformed in those places where the conductive path has the second thickness and/or second width. This may result in a conductive circuit having a high reliability. Furthermore, this may compensate for a thickness and/or width variation of the conductive material as a result of the bending, or deformation, of the conductive material. In an embodiment the conductive material is printed on the substrate using screen printing and the width of the conductive material is designed such that it is larger at the locations or regions where the substrate will be deformed or bent. In another embodiment the conductive material is printed on the substrate using inkjet printing and the thickness of the conductive material that is printed on the substrate is made larger at the locations or regions where the substrate will be deformed or bent. In step S3, at least one electronic component 4 is placed on the substrate 2 and the conductive material 3, for example by means of a pick-and-place machine. In FIG. 2b, several electronic components 4 are placed on the substrate 2 and the conductive material 3. The electronic components 4 can comprise one or more light-emitting devices. The light-emitting devices can be SSL devices, such as semiconductor LEDs, organic LEDs, polymer LEDs and laser diodes. The electronic components 4 can comprise one or more SSL dies having one or more SSL devices.

Each electronic component 4 can be provided with at least one electrical connection part 4a forming an electrical interface, or a part of an electrical interface, between the electronic component 4 and the printed layer of the conductive material 3. The electrical connection part 4a can be a metallic pin, and it may comprise Ag, for example in the form of a coating.

In step S4, the electronic components 4 are fixed at their positions so that they are maintained in place during the step of forming the planar substrate 2 into a non-planar shape (see step S5 below). The fixation of the electronic components 4 can be achieved by chemical means, such as adhesives. The electronic components 4 can for example be glued to the substrate 2. A laser can be used for curing the glue. Alternatively, or additionally, the electronic components 4 can be fixed at their positions by mechanical means. For instance, the electronic components 4 can be fixed to the substrate 2 by springs, screws, nails and/or clamps.

Note that fixing the positions of the electronic components 4 does not have to involve attaching the electronic components 4 to the substrate 2. The electronic components 4 can for example be fixed at their positions by a support or an external structure, such as a robot arm or a plate, which is removed after the planar substrate 2 has been formed into a non-planar shape (see step S5 below). The electronic components 4 are then attached to the substrate 2 at a later stage in the manufacturing process.

In step S5, the planar substrate 2 is formed into a non-planar shape, for example by thermoforming. Low pressure forming or high pressure forming can be used. The planar substrate 2 can be formed into a non-planar shape by vacuum deep drawing. These forming techniques are deemed to be known to the skilled person and thus require no further description. They are frequently used to form various household goods such as funnels, cups, bowls, lids, trays and compartmented plates and containers. They can be used to form kitchen sinks, dish antennas, boat hulls as well as car dashboards. Products having for example wavy shapes, indented shapes, rounded shapes and/or angular shapes can be produced by these methods. A non-planar may for example be a shape which comprises two or more planar regions. For example, the non-planar shape is the result of bending, or forming, the substrate along a line over a specific angle resulting in two connected planar regions which have an angle with respect to each other that is different from 180 degrees. FIG. 2c shows an example of five connected and mutually angled planar regions with an angle of approximately 45 degrees.

During the forming step, it may be advantageous to use a protective structure in order to help prevent the electronic components 4 and the printed layer of the conductive material 3 from being damaged, for example as a result of their coming into contact with tools used for forming the substrate 2. Male and/or female forming tools can be used.

The substrate can be formed into the shape of a surface of a heat sink. This can be achieved by forming the substrate 2 by means of an appropriate mechanical mould. In particular, the heat sink can be used as the mechanical mould. This way, the substrate 2 can be formed directly on top of the heat sink. The heat sink can be provided with air vents allowing air to be removed during the forming step, something which helps prevent the formation of air pockets. Furthermore, during the forming step, the substrate 2 may be stretched over one or more mechanical structures intended for fixation of the substrate 2 on top of the heat sink. The mechanical structures can be one or more edges of the heat sink. There may be a layer of an adhesive provided between the heat sink and the substrate 2. Such a layer can help improve the adhesion of the substrate 2 to the heat sink. The adhesive can be a thermally curable adhesive which is cured during the curing of the conductive material in step S6 (see below).

In step S6, which succeeds step S5 in which the planar substrate 2 is formed into a non-planar shape, the conductive material 3 is cured. The curing may be achieved through, for example, heating, radiation or the use of chemical additives. The curing temperature can be higher than about 160° C., alternatively higher than about 200° C. or higher than about 300° C. In general, it is desirable to use a high curing temperature because the conductivity of the cured conductive material 3 typically increases with increased curing temperature. This can result in lower production costs since, the higher the conductivity of the conductive material 3, the less conductive material 3 is required.

The curing can result in the conductive material 3 mechanically securing the electronic components 4 to the substrate 2. A discussion relating to conductive materials having this capability can be found in the non-published patent application EP13175646. Furthermore, the curing of the conductive material 3 in step S6 can result in electrical connections being formed between the electrical components 4 and the conductive material 3. The step S7 described below may then be omitted.

Furthermore, after the curing discontinuities, such as cracks, at the non-planar locations or regions, i.e. where the substrate is deformed out of its original planar shape, of the cured conductive material are reduced considerably, or even become absent. Because the conductive material is cured after the forming of the substrate, the conductive material will exhibit less stress, resulting in less, or even zero, cracks or other discontinuities in the conductive material compared to forming a substrate with cured conductive material.

In step S7, the electronic components 4 are electrically connected to the cured conductive material 3, for example by chemical means such as a conductive glue. Soldering can be used for electrically connecting the electronic components 4 to the cured conductive material 3. In some applications, for example those in which the electronic components 4 comprises high-powered LEDs, soldering may be advantageous because soldered connections can result in heat being efficiently transferred away from the electronic components 3. A layer of solder may be provided on the electronic components 4 before they are positioned on the uncured conductive material 3 so that there is a layer of solder between the cured conductive material 3 and the electronic components 4. The soldering temperature can be higher than the curing temperature. The curing and the soldering may then be performed by first curing the conductive material 3 at a certain temperature and then raising the temperature in order to solder the electrical components 4 on the cured conductive material 3.

Figure 2A:
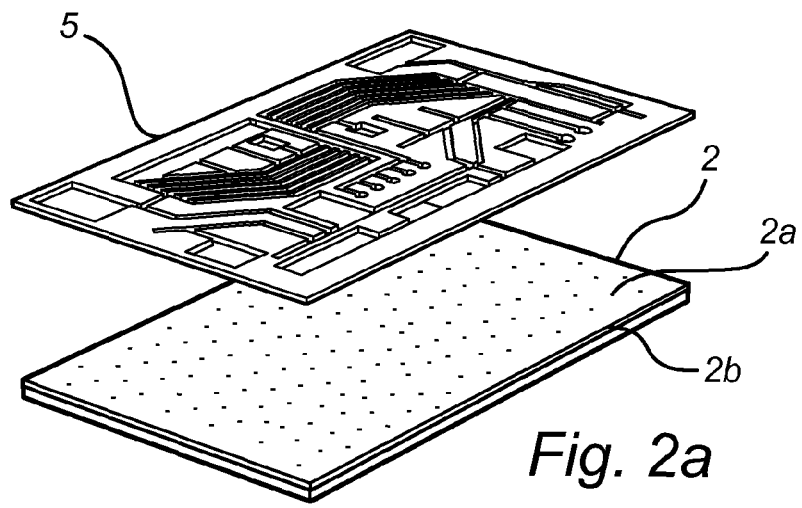
FIGS. 2a-2c are schematic perspective illustrations of some of the steps of the method illustrated in FIG. 1.
Figure 2B:
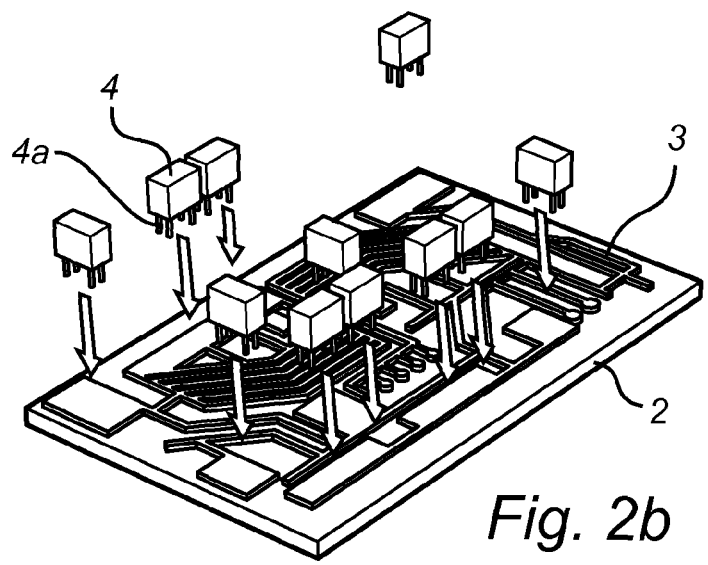
Figure 2C:
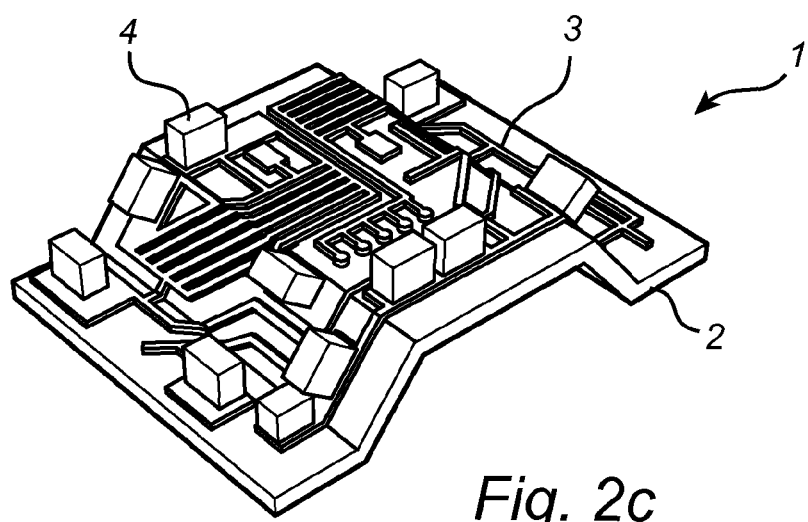
Figure 3A:
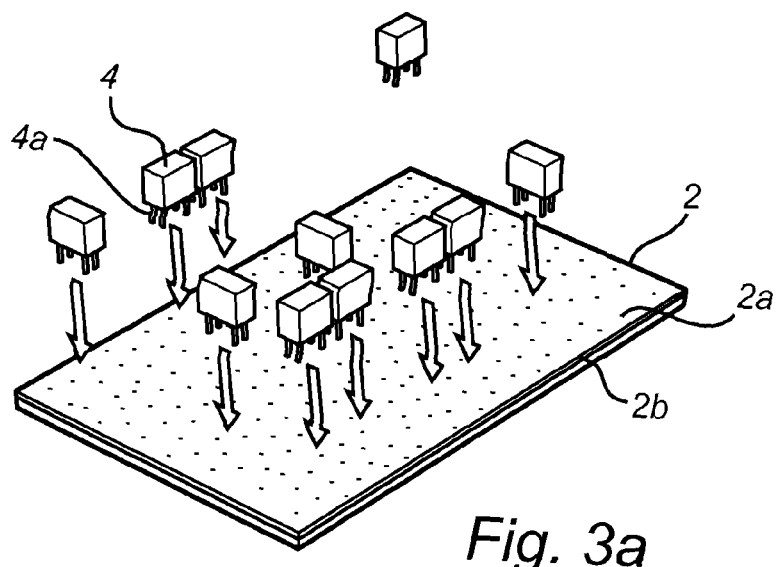
FIG. 3a-3c are schematic perspective illustrations of some of the steps of the method illustrated in FIG. 1 and show the steps performed in a different order than in FIGS. 2a-2c.
Figure 3B:
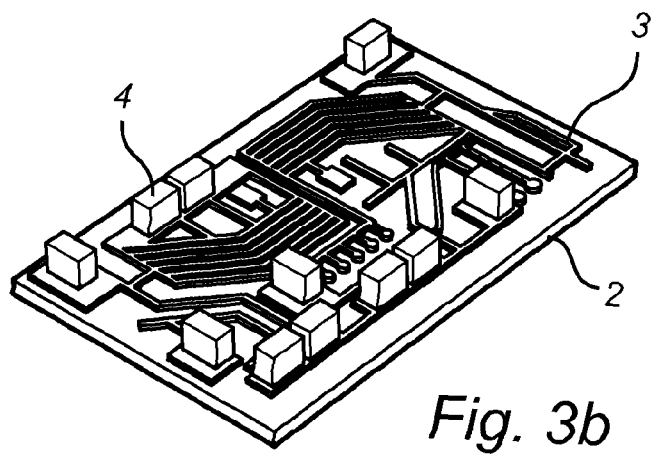
Figure 3C:
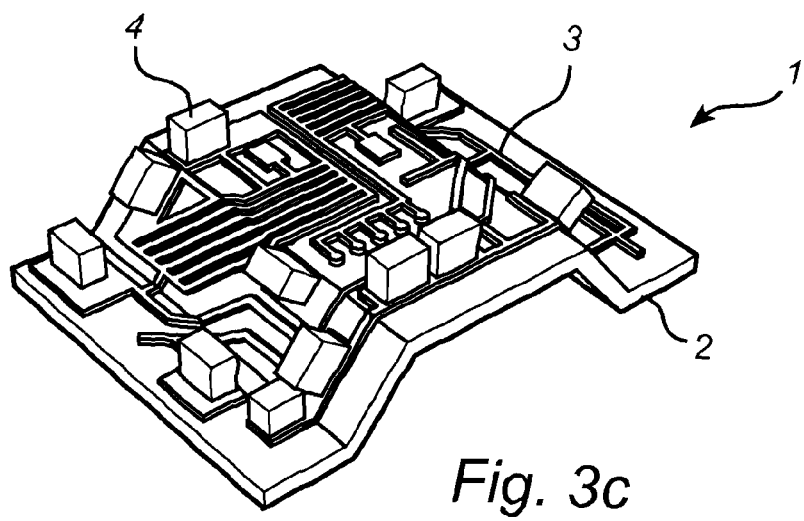

FIGS. 3a to 3c are similar to FIGS. 2a to 2c. To be more precise, in FIGS. 2a to 2c, step S2 is carried out before step S3, i.e. the conductive material 3 is printed on the substrate 2 before the electronic components 4 are placed on the substrate 2 and the conductive material 3. In FIGS. 3a to 3c, however, step S2 is carried out after step S3, i.e. the electronic components 4 are placed on the substrate 2 before the conductive material 3 is printed on the substrate 2. In such case, a step stencil, which has relief areas for the electronic components 4, can be used during the printing process.

The non-planar circuit board assembly 1 can for example be used in a lighting system having one or more SSL devices, such as an LED light engine, an LED lamp or an LED luminaire. The lighting system may also include a heat sink for cooling the lighting system. A thermal paste may be provided between the non-planar printed circuit board assembly 1 and the heat sink in order to increase the thermal conductivity between non-planar printed circuit board assembly 1 and the heat sink. The thermal paste may be a glue having a high thermal conductivity. The thermal paste may be silicon. The heat sink may have structures to improve air cooling. The heat sink may have a flat surface providing a thermal interface to another heat sink, and there may be an electrically insulating layer provided between the two heat sinks. The electrically insulating layer can provide an electrical safety barrier, as required by certain safety standards. The electrically insulating layer may be adapted to provide a high thermal conductivity between the two heat sinks.

The person skilled in the art realizes that the present invention by no means is limited to the preferred embodiments described above. On the contrary, many modifications and variations are possible within the scope of the appended claims. For example, the method described above may comprise several printing steps. In particular, a layer of an insulating material can be printed on the layer of the conductive material 3. It is often advantageous to print two or more insulating layers as this may reduce the risk of pin holes.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:
1. A method for manufacturing a non-planar printed circuit board assembly, comprising:
 providing a planar formable substrate for supporting a conductive material and at least one electronic component,
 printing a circuit pattern of an uncured conductive material on the planar substrate, forming the substrate and the uncured conductive material into a non-planar shape, and curing the conductive material, wherein the substrate comprises a metal sheet and an electrically insulating coating arranged between the metal sheet and the conductive material.

2. The method according to claim 1, wherein the uncured conductive material is printed on the substrate using screen printing technology.

3. The method according to claim 1, wherein the uncured conductive material is printed on the substrate using inkjet printing technology.

4. The method according to claim 1, wherein the substrate and the uncured conductive material are formed into a non-planar shape by vacuum deep drawing.

5. The method according to claim 1, wherein the substrate is formed into a shape of a surface of a heat sink onto which the non-planar printed circuit board assembly is intended to be mounted.

6. The method according to claim 1, comprising arranging at least one electronic component on the planar substrate before printing.

7. The method according to claim 1, comprising arranging at least one electronic component on the printed uncured conductive material on the planar substrate.

8. The method according to claim 7, wherein, after curing, the conductive material mechanically secures said at least one electronic component to the substrate.

9. The method according to claim 1, wherein the uncured conductive material is printed on the planar substrate such that a conductive path of the circuit pattern has sections with a first thickness and sections with a second thickness different from the first thickness, and wherein the step of forming the substrate and the uncured conductive material comprises bending the substrate where the conductive path has the second thickness.

10. The method according to claim 9, wherein the second thickness is greater than the first thickness.

11. The method according to claim 1, further comprising the step of mounting the substrate on a heat sink wherein the substrate has a shape of a surface of the heat sink, which surface faces the substrate.

12. The method according to claim 1, wherein the electrically insulating coating comprises light reflecting particles.

* * * * *